United States Patent [19]

Murakami

[11] Patent Number: 5,032,718

[45] Date of Patent: Jul. 16, 1991

[54] PHOTO SENSOR ARRAY AND READER WITH HEXAGONAL FIBER BUNDLES

[75] Inventor: Satoru Murakami, Kobe, Japan

[73] Assignee: Kanegafuchi Kagaku Kogyo Kabushiki Kaisha, Osaka, Japan

[21] Appl. No.: 611,385

[22] Filed: Nov. 13, 1990

Related U.S. Application Data

[63] Continuation of Ser. No. 305,690, Feb. 3, 1989, abandoned.

[30] Foreign Application Priority Data

Feb. 10, 1988 [JP] Japan ................................. 63-29569

[51] Int. Cl.⁵ ........................... H01J 40/14; H01J 5/16
[52] U.S. Cl. ............................ 250/227.20; 250/227.28; 250/208.1; 350/96.25
[58] Field of Search ................... 250/227, 578, 227.20, 250/227.26, 208.1, 227.28, 578.1; 357/30 M, 30 KH; 358/484; 350/96.25, 96.1

[56] References Cited

U.S. PATENT DOCUMENTS

| | | | |
|---|---|---|---|
| 4,185,888 | 1/1980 | Quelle, Jr. ........................ | 350/96.25 |
| 4,227,078 | 10/1980 | Yamamoto et al. ............... | 250/227 |
| 4,232,219 | 11/1980 | Yamamoto et al. ............... | 250/227 |
| 4,233,506 | 11/1980 | Yamamoto et al. ............... | 250/227 |
| 4,408,230 | 10/1983 | Tamura et al. .................... | 250/578 |
| 4,418,284 | 11/1983 | Ogawa et al. ..................... | 250/208.1 |
| 4,611,124 | 9/1986 | Schneider ......................... | 250/578 |
| 4,650,524 | 3/1987 | Kiyama et al. .................... | 357/30 K |
| 4,671,612 | 6/1987 | Sakurai et al. .................... | 250/227 |
| 4,754,152 | 6/1988 | Hayama et al. ................... | 357/30 K |
| 4,805,982 | 2/1989 | Tomoyori et al. ................ | 350/96.25 |
| 4,831,429 | 5/1989 | Nakashima et al. ............... | 357/30 |
| 4,855,802 | 8/1989 | Kato .................................. | 357/58 |

FOREIGN PATENT DOCUMENTS 59-41629 10/1984 Japan .
60-74766 4/1985 Japan .

Primary Examiner—David C. Nelms
Assistant Examiner—Michael Messinger
Attorney, Agent, or Firm—Armstrong, Nikaido, Marmelstein, Kubovcik, & Murray

[57] ABSTRACT

A photo sensor array includes at least one transparent substrate and a photo sensitive portion provided on the substrate. An optical fiber portion is arranged in a transparent substrate whereinto light from a radiating portion enters. An optical unit or selfoc lens for transferring an image to a photo sensor portion can be omitted so that the device can be miniaturized. A reader utilizing the above photo sensor array is also disclosed.

4 Claims, 6 Drawing Sheets

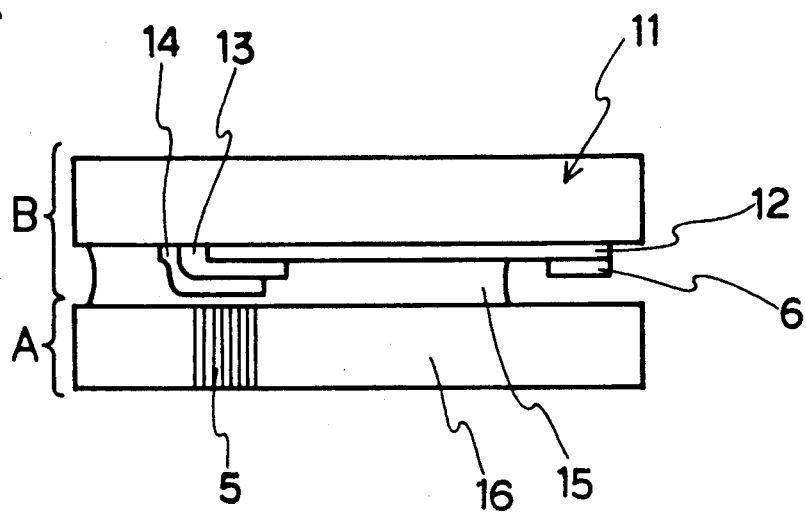
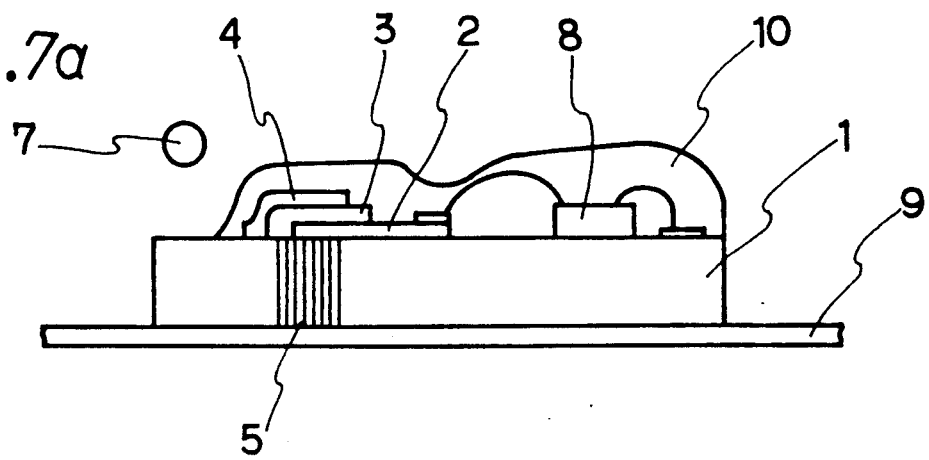
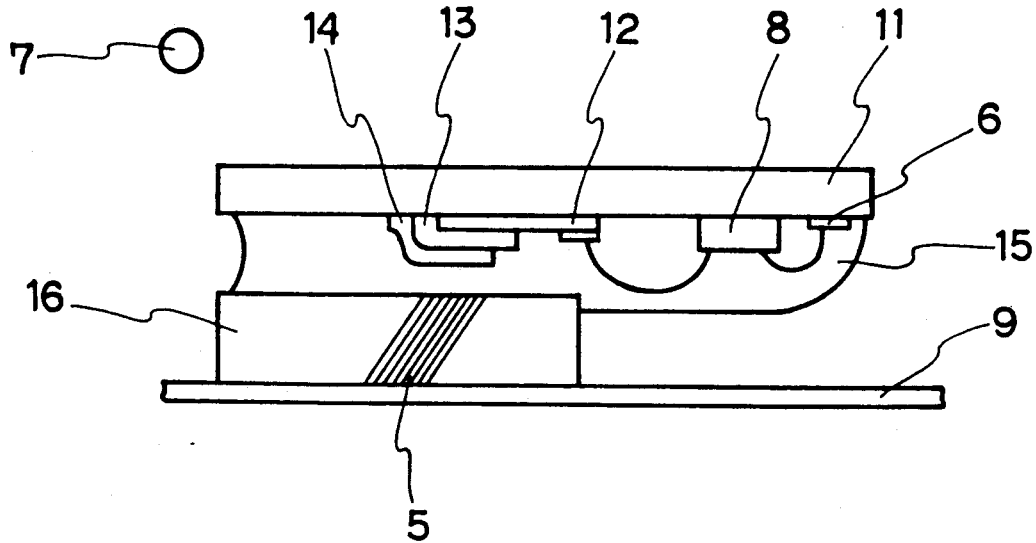

PHOTO SENSOR ARRAY AND READER WITH HEXAGONAL FIBER BUNDLES

This application is a continuation of application Ser. No. 305,690 filed Feb. 3, 1989 now abandoned.

BACKGROUND OF THE INVENTION

The present invention relates to a photo sensor array and a reader, and more particularly to a photo sensor array and a reader which require neither an optical unit or a selfoc lens nor etching step, and which can improve the yield of products.

Hitherto, singlecrystalline sensors such as CCD having a structure in which plural MOS sensors are linerly arranged, or contact-type sensors using amorphous semiconductor or CdS have been used as reading sensors in telecopier equipments and the like. However, in singlecrystalline sensors, the size the of photo-receiving portion is small, so that an optical device including, for example, a lens for converging reflected light from a manuscript is required to be provided between the manuscript to be read and the sensor. In that case, an appropriate optical path is required so that the device inevitably becomes large. For contact-type sensors, the device can be miniaturized since an optical path is not required due to the use of a selfoc lens. However, the contact-type sensor has a drawback because a selfoc lens is required to be provided on the photo sensor array.

Recently there has been proposed a perfect-contact-type sensor using amorphous semiconductor wherein a part of the semiconductor is removed (patterned) by an etching process and the light is designed to enter into the etched portion. This type of sensor has, however, a drawback because of pinholes generated in the semiconductor layer during the etching process which lowers the yield of the products.

The present invention was made to solve the above-mentioned drawbacks of the conventional photo sensor arrays, and it is an object of the present invention to provide a photo sensor array and a reader which do not require an optical unit or a selfoc optical unit, and which can improve the yield of products since an etching treatment or the like, is not required for the semiconductor layer.

SUMMARY OF THE INVENTION

In accordance with the present invention, a photo sensor array comprises at least one transparent substrate and a photosensitive portion provided on the transparent substrate. An optical fiber portion is arranged in a transparent substrate on the light-incident side of the photosensitive portion. A reader comprises a photo sensor array, a radiating portion (lighting portion), and a driving circuit.

BRIEF EXPLANATION OF THE DRAWINGS

FIG. 6 is a schematic sectional view of a second example of a photo sensor array of the present invention;

FIGS. 7a and 7b are schematic sectional views of embodiments of readers of the present invention;

DETAILED DESCRIPTION

A photo sensor array and a reader of the present invention are explained based on the accompanying drawings.

Figure 1:
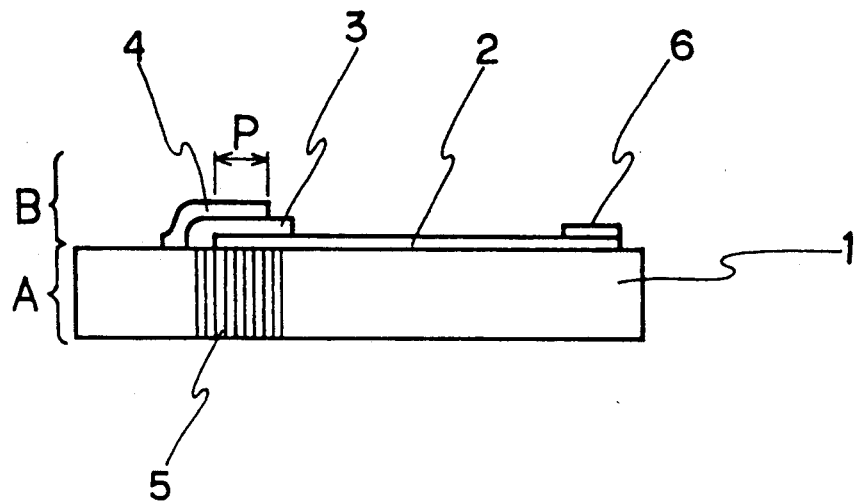
FIG. 1 is a schematic sectional view of a first embodiment of a photo sensor array of the present invention.
Figure 2:
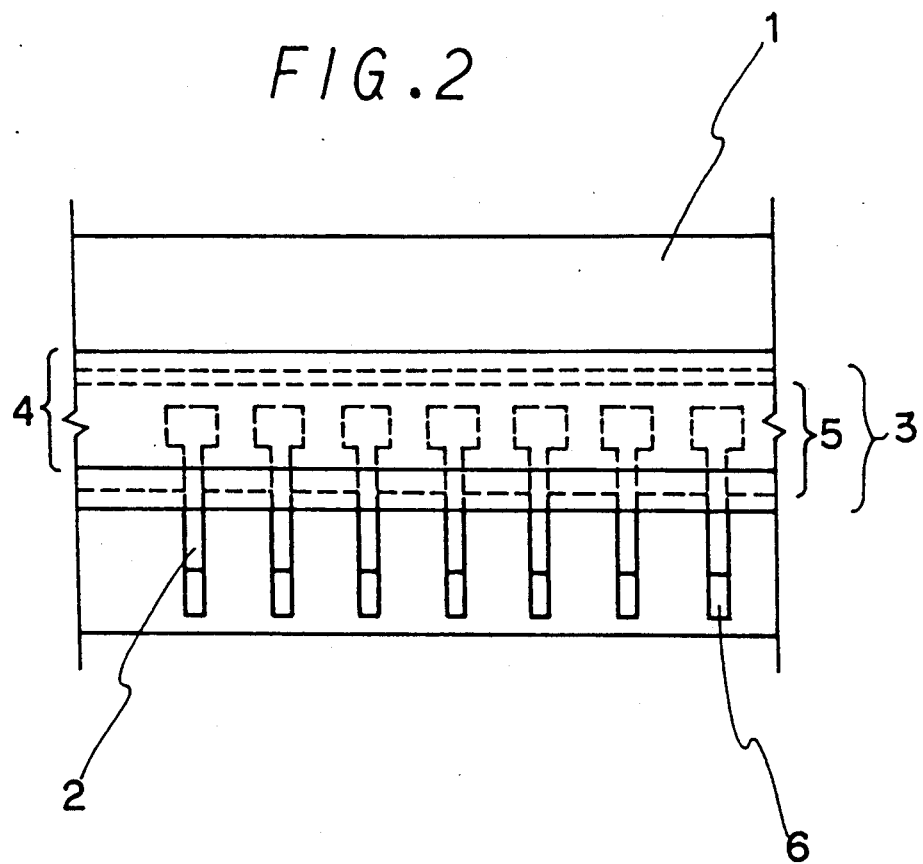
FIG. 2 is a plan view of the photo sensor array of FIG. 1.

FIGS. 1 and 2 show a first embodiment of a photo sensor array of the present invention. In FIGS. 1 and 2, a photo sensor array comprises a transparent substrate 1 constituting a fiber array portion A comprising an optical fiber portion 5, and a sensor portion B composed of a first transparent electrode 2, a semiconductor layer 3 and a second electrode 4. The first electrode 2, semiconductor layer 3 and second electrode are formed on the substrate 1 in this order.

As a transparent substrate 1, a glass plate of about 0.5 to 10 mm in thickness and the like can be employed. The characteristic of a photo sensor array of the present invention is that the transparent substrate 1 constituting the optical fiber array portion A has an optical fiber portion 5 arranged in the substrate and comprising optical fibers. Accordingly, the transparent substrate 1 itself functions as an image-transferring plate. An optical unit or selfoc lens for transferring images to a photo sensor portion is not necessary.

It is preferable that the direction of optical fibers arranged in the transparent substrate 1 is substantially perpendicular to the surface of the substrate 1. The direction of optical fibers is not, however, limited in the present invention and may be inclined to an angle not exceeding 45 degrees as shown in FIG. 7b.

Figure 3:
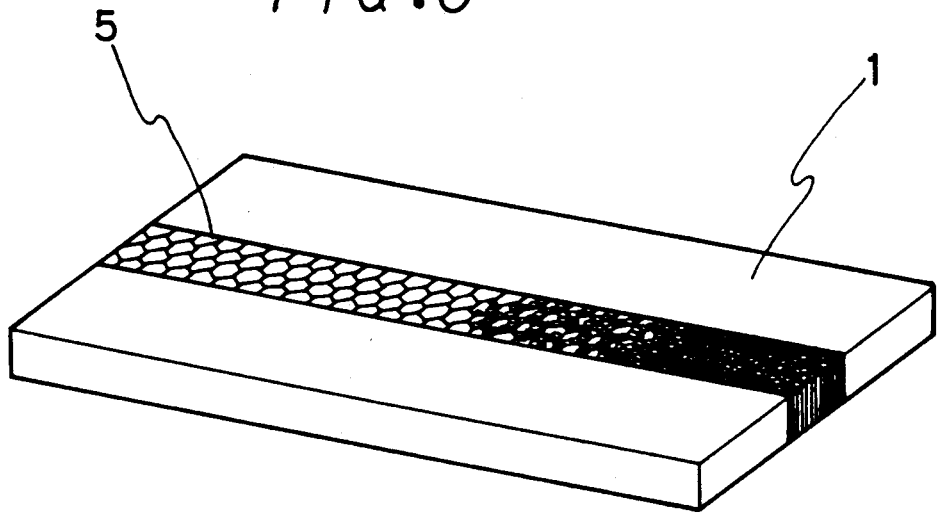
FIG. 3 is a perspective view of an example of a transparent substrate having an optical fiber portion in the present invention.
Figure 4:
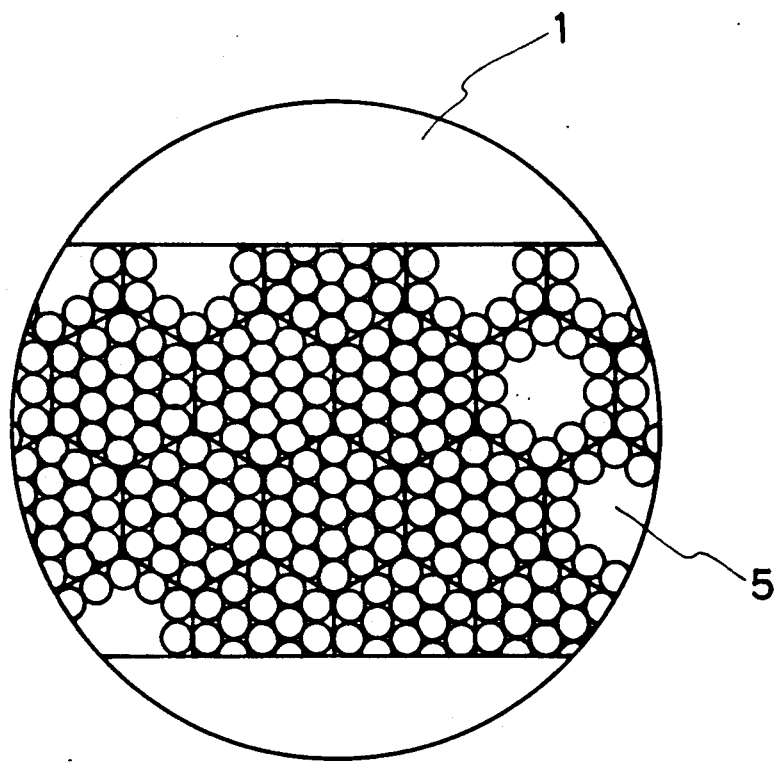
FIG. 4 is a partially enlarged plan view of the optical fiber portion in the transparent substrate of FIG. 3.

The optical fiber portion 5 might be linearly arranged as shown in FIG. 3, or might be arranged planarly or two-dimensionally (not shown). Optical fibers might be so arranged that, for example, hexagonal bundles comprising optical fibers continue as shown in FIG. 4. The hexagonal bundles are arranged in a plurality of lines, and about eight bundles corresponds to one cell of the photo sensor. The sectional area of an optical fiber is preferably not more than one-half, more preferably not more than one-fourth, of an area of the substantial photosensitive portion (such an area that the first electrode and second electrode overlap each other, refer to symbol P in FIG. 1). In the specification, the term "photosensitive portion" means—a portion generating an electrical signal depending on the incident light—. The sectional area of an optical fiber is preferably not less than 0.1 $\mu m^2$. A fiber comprising a core portion and a clad, or a fiber further having a absorber outside the clad is employable. It is preferable that the area of the optical fiber portion 5 is larger than that of the substantial photosensitive portion. In FIGS. 3 and 4, only a part of the optical fibers is shown for the sake of understanding the drawings.

As a material for the transparent first electrode 2, ITO, $In_2O_2$, $SnO_2$, $ZnO_2$ and the like can be employed. The electrode 2 is formed on the transparent substrate 1 by a sputtering method, a vapor deposition method, a CVD method and the like. On the first electrode 2, a metal pad 6 for bonding wires to the electrode 2 can be formed by the vapor deposition method and the like.

The semiconductor 3 includes an amorphous semiconductor, and it is preferable to use a semiconductor containing Si as a main component. The semiconductor 3 might be substantially solely composed of an i-type layer, or has a pi structure (such a structure that consists of a p-type doped layer and an i-type layer), a pin structure or an in structure. Further, such a semiconductor as having a structure of pipi . . . pi, pinpin . . . pin, or inin . . . in can also be used. That is, there can be used a semiconductor having a structure of a p-type a-SiC/i-type a-Si/n-type a-Si, or p-type a-SiC/i-type Si/n-type a-SiC. The semiconductor layer 3 might be so formed that the light firstly enters the p-type semiconductor layer or n-type semiconductor layer.

The semiconductor layer 3 is formed on the first electrode 2 and the transparent substrate 1 by an rf plasma CVD method, a light excitation CVD method, a thermal CVD method, a sputtering method and the like.

As the second electrode 4, a metal electrode made of Al, Cr, Ni, Ni-Cr, Mo, Ag, Au and the like can be used. The second electrode 4 is formed on the semiconductor layer 3 and transparent substrate 1 by the vapor deposition method or sputtering method.

The thicknesses of the first electrode 2, semiconductor layer 3 and second electrode, which vary depending on the materials used, are about from 300 Å to 1 $\mu$m, from 0.3 to 5 $\mu$m and from 1000 Å to 2 $\mu$m, respectively.

Figure 5A:
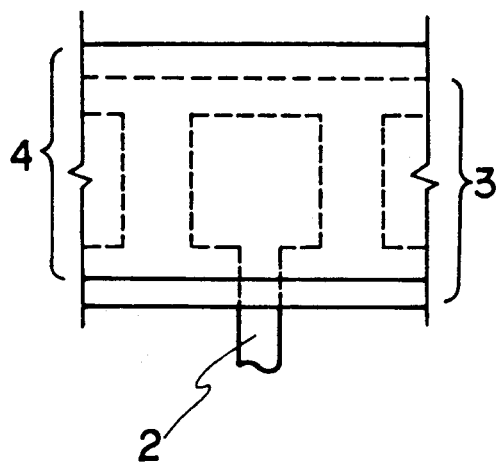
FIGS. 5a, 5b, 5c and 5d are views explaining various embodiments of electrodes and semiconductor layers.
Figure 5B:
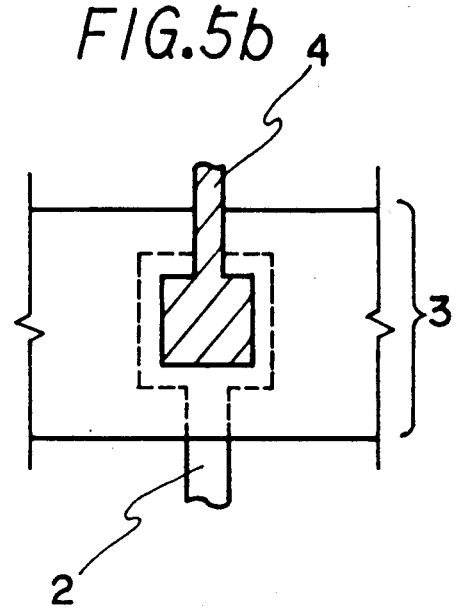
Figure 5C:
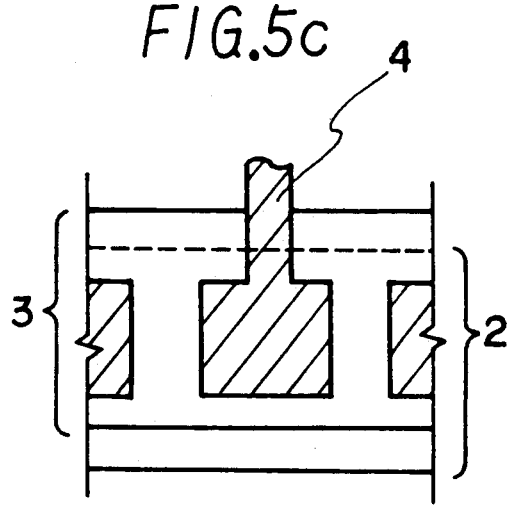

With respect to the constitution of the first electrode 2 and second electrode 4, the first electrode 2 might be patterned and divided as shown in FIG. 5a while the second electrode 4 is formed into a common electrode, or the second electrode 4 might be patterned and divided as shown in FIG. 5c while the first electrode 2 is formed into a common electrode. Further, both electrodes might be patterned and divided as shown in FIG. 5b.

Figure 5D:
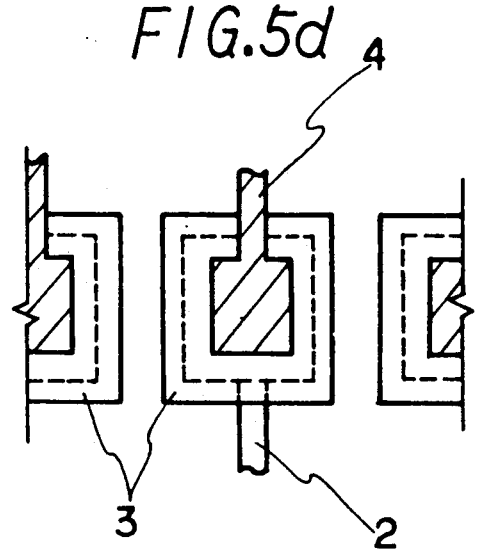

In the photo sensor array of the present invention, any one of a continuous semiconductor layer (see FIGS. 5a, 5b and 5c) and patterned semiconductor layer (see FIG. 5d) can be used. When the p-type layer or n-type layer made of a-SiC is used in the semiconductor layer 3, it is preferable to use a continuous semiconductor layer since the resistance of the p-type layer or n-type layer can be made relatively high and accordingly cross talk between each photo element (or sensor) can be reduced. When both first electrode 2 and second electrode 4 are patterned, it is preferable that the area of the first electrode 2 is designed to be substantially equal to that of the second electrode 4. In the embodiment of FIG. 5d, either first electrode 2 or second electrode 4 might be a continuous electrode.

In the above explanation, a p-type semiconductor or an n-type semiconductor can be used in the semiconductor layer and the semiconductor layer 3 can be formed into a continuous one only when electric conductivity of the p-type or n-type layer contacting with the patterned electrode is not more than about $10^{-6}$ $(\Omega\cdot cm)^{-1}$.

In the above explanation, a transparent first electrode, a semiconductor layer and a second electrode are formed as a sensor portion B on a fiber array portion A comprising a transparent substrate. In the second embodiment of the present invention shown in FIG. 6, a first electrode 12, a semiconductor layer 13 and a transparent second layer 14 are formed as a sensor portion B on a first transparent substrate 11. The first transparent substrate in the sensor portion B and a second transparent substrate 16 constituting a fiber array portion A are adhered to each other by an adhesion layer 15 made of transparent resin.

As the first transparent substrate 11, a glass plate of about 0.5 to 2 mm in thickness and the like can be used. The first electrode 12, semiconductor layer 13 and transparent second electrode 14 respectively correspond to the second electrode 4, semiconductor layer 3 and transparent first electrode 2 in the above-mentioned first embodiment. The forming methods thereof are the same as in the first embodiment. Further, various kinds of embodiments stated in relation to the first embodiment are also applicable to the first electrode 12, semiconductor layer 13 and transparent second electrode 14.

A transparent resin having an adhesion function can be used as a material for the adhesive layer 15. Examples of the resin are, for instance, acrylic resin, epoxy resin and silicone resin. Usable resins are not, however, limited thereto in the present invention.

The optical fiber portion 5 can receive the light from a radiating portion 7 at the back of the photo sensor portion, as shown in FIG. 7b, since the adhesive layer 15 is transparent.

The optical fiber portion 5 arranged in the second transparent substrate 16 constituting the fiber array portion A is preferably substantially perpendicular to the surface of the substrate 16 like in the case of the above-mentioned first embodiment. However, the optical fiber portion 5 might, of course, be inclined to the surface of the substrate 16.

Figure 10:
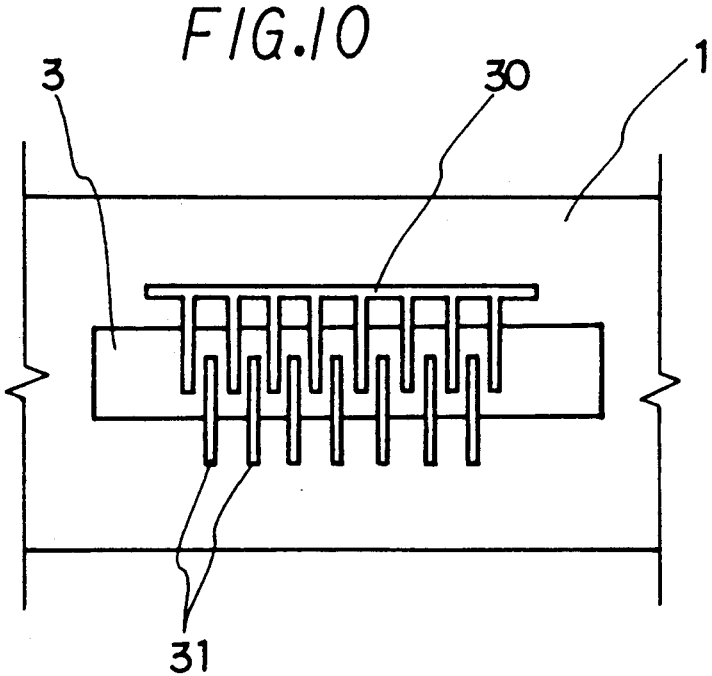
FIG. 10 is a schematic plan view of a third embodiment of a photo sensor array of the present invention.
Figure 11A:
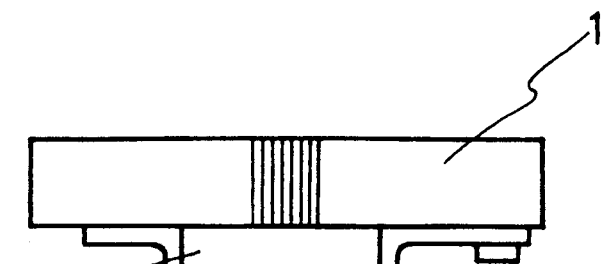
FIGS. 11a, 11b, 11c and 11d are views explaining various embodiments of electrodes in the photo sensor array of the present invention.
Figure 11B:
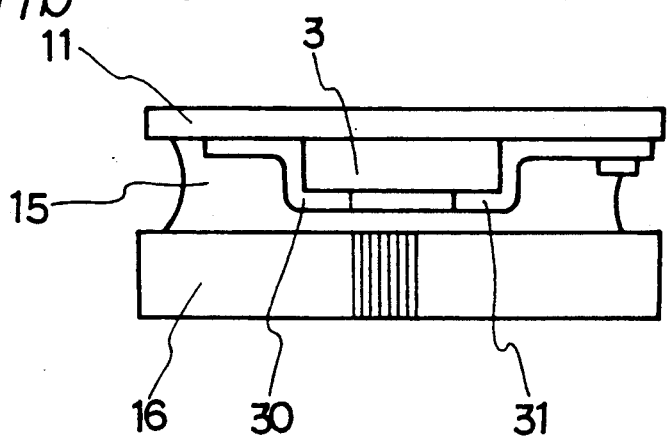
Figure 11C:
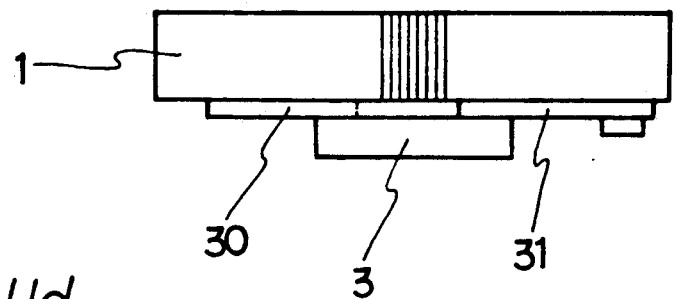
Figure 11D:
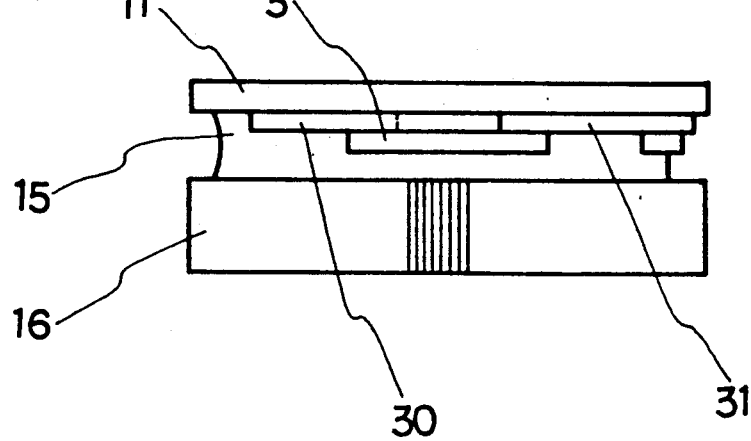

The above explanation is based on embodiments wherein two electrodes (i.e. the first electrode and second electrode) are so arranged as to sandwich the semiconductor layer therebetween. The electrodes might adapt a comblike arrangement as shown in FIG. 10. In the third embodiment of FIG. 10, a common electrode 30 and a plurality of independent electrodes 31 are provided on the semiconductor layer 3 formed on the transparent substrate 1. Each of a plurality of independent electrodes 31 is arranged between comblike electrodes of the common electrode. Both of transparent electrode and metal electrode can be used for the electrodes 30, 31. The electrodes 30, 31 might be formed on the semiconductor layer 3 (see FIGS. 11a and 11b), or might be formed between the semiconductor layer 3 and the transparent substrate 1 or first transparent substrate 11 (see FIGS. 11c and 11d).

It is preferable to use a doped semiconductor, for example doped a-SiC or a-SiN, as a p-type layer or an n-type layer in the semiconductor layer 3, since the doped semiconductor layer facilitates the fabrication of relatively high resistant film and has a high sensitivity due to no photo absorption loss.

In order to improve the heat resistance of the second electrode 4, a layer (not shown) comprising a silicide of Cr, Mo, Ni and the like might be formed between the semiconductor layer 3 and the second electrode 4. The heat resistant layer can be formed by the vapor deposition method or sputtering method. The thickness of the layer is about 20 to 300 Å.

Figure 9:
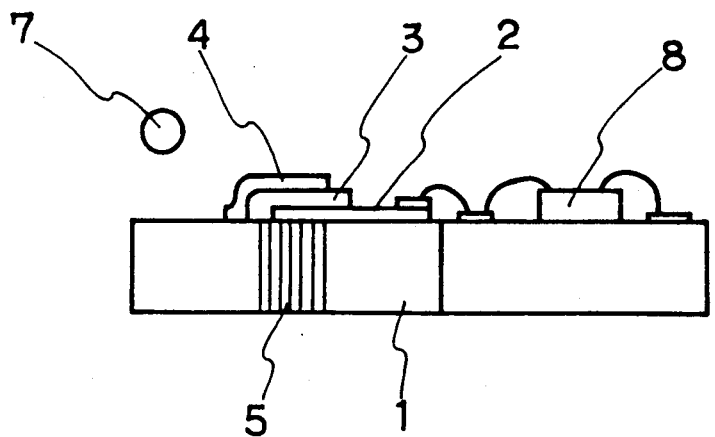
FIG. 9 is a schematic sectional view of another embodiment of a reader of the present invention.

Next, a reader of the present invention is explained. The reader of the present invention comprises a photo sensor array as stated above, a radiating portion (lighting portion) 7, and a driving circuit 8. A fluorescent lamp, LED (Light Emitting Diode) and the like having a visible light spectrum are used for the radiating portion 7. IC (Integrated Circuit) is generally used for the driving circuit 8. The driving circuit 8 might be carried by the same substrate as the photo sensor array (see FIGS. 7a and 7b), or might be carried by another substrate beforehand and then be bonded with the photo sensor array (see FIG. 9). In the reader of the present invention, any one of the photo sensor array of the first embodiment, second embodiment and third embodiment can be used. FIG. 7a and FIG. 9 show embodiments of readers wherein the photo sensor array of the first embodiment is used. In FIG. 7b, the photo sensor array of the second embodiment is used. The optical fiber portion 5 in the reader of FIG. 7b is so arranged as to be inclined about 20° to 30° with respect to the surface of the substrate. Numeral 9 in FIGS. 7a and 7b is a manuscript to be read by the photo sensor array, and numeral 10 in FIG. 7a is a protective resin made of photo-setting resin, thermosetting resin and the like for protecting the photo sensor array and driving circuit.

Figure 8:
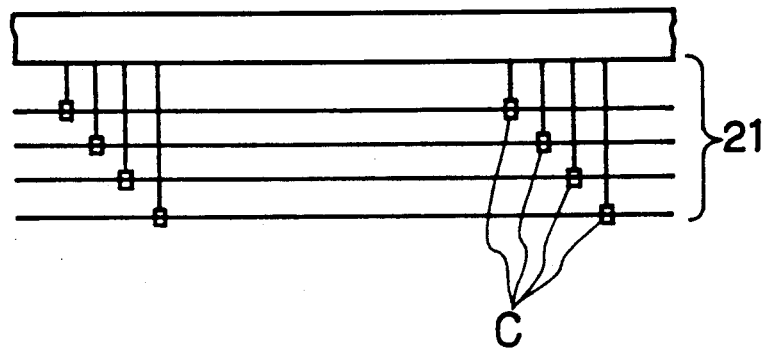
FIG. 8 is a view explaining the matrix wiring on a transparent substrate.

When the photo sensor array and driving circuit are carried by the same substrate, matrix wiring might be applied to the substrate as shown in FIG. 8 in order to reduce the number of driving circuits used. In FIG. 8, a part of substrate 21 whereon the matrix wiring is provided is coated with photosensitive polyimide and the like. Small holes are made on portions C at which signal lines from photo sensors are connected to lateral signal-processing lines.

According to the photo sensor array and reader of the present invention, the device can be miniaturized since an optical unit or selfoc lens for transferring an image to a photo sensor portion is not necessary. Further, the yield of the product can be remarkably improved since a semiconductor layer is not required to be etched.

What is claimed is:

1. A photo sensor array comprising:
   at least one transparent substrate;
   a photosensitive portion provided on the at least one transparent substrate, the photosensitive portion including
      a semiconductor layer including a layer made of amorphous silicon carbide at least on a light-incident side, and
      two electrodes; and
   an optical fiber portion arranged in the at least one transparent substrate on the light-incident side of the photosensitive portion said optical fiber portion including closely-packed glass fibers forming hexagonal bundles.

2. A reader comprising:
   a photo sensor array having
      at least one transparent substrate,
      a photosensitive portion provided on the at least one transparent substrate, the photosensitive portion including
         a semiconductor layer including a layer made of amorphous silicon carbide at least on a light-incident side, and
         two electrodes, and
      an optical fiber portion arranged in the at least one transparent substrate on the light-incident side of the photosensitive portion, said optical fiber portion including closely-packed glass fibers forming hexagonal bundles;
   a radiating portion; and
   a driving circuit.

3. A photo sensor array comprising:
   at least two transparent substrates;
   a photosensitive portion provided on one transparent substrate, the photosensitive portion including
      a semiconductor layer including a layer made of amorphous silicon carbide at least on a light-incident side, and
      two electrodes;
   an optical fiber portion arranged in another of the at least two transparent substrates on the light-incident side of the photosensitive portion said optical fiber portion including closely-packed glass fibers forming hexagonal bundles; and
   an adhesive layer of transparent resin provided between said one transparent substrate and said another of the at least two transparent substrates, said adhesive layer preventing direct contact between the optical fiber portion and the photosensitive portion.

4. A reader comprising:
   a photo sensor array having
      at least two transparent substrates,
      a photosensitive portion provided on one transparent substrate, the photosensitive portion including
         a semiconductor layer including a layer made of amorphous silicon carbide at least on a light-incident side, and
         two electrodes,
      an optical fiber portion arranged in another of the least two transparent substrate on the light-incident side of the photosensitive portion, said optical fiber portion including closely-paced glass fibers forming hexagonal bundles, and
      an adhesive layer of transparent resin provided between said one transparent substrate and said another of the at least two transparent substrates, said adhesive layer preventing direct contact between the optical fiber portion and the photosensitive portion;
   a radiating portion; and
   a driving circuit.

* * * * *

UNITED STATES PATENT AND TRADEMARK OFFICE
CERTIFICATE OF CORRECTION

PATENT NO. : 5,032,718
DATED : July 16, 1991
INVENTOR(S) : Satoru Murakami et al It is certified that error appears in the above-identified patent and that said Letters Patent is hereby corrected as shown below:

On the cover page, Item [75], after "Kobe", delete ",", and insert therefor -- ; Akimine Hayashi, Kobe; Minori Yamaguchi, Akashi; Takehisa Nakayama, Kobe; Yoshihisa Tawada, Kobe; Masataka Kondo, Amagasaki; Jun Takada, Kobe, all of --.

Signed and Sealed this

Twenty-ninth Day of December, 1992

Attest:

DOUGLAS B. COMER

*Attesting Officer*      Acting Commissioner of Patents and Trademarks